(12) United States Patent
Moon

(10) Patent No.: US 7,572,571 B2
(45) Date of Patent: Aug. 11, 2009

(54) IMAGE SENSOR AND METHOD FOR MANUFACTURING THE SAME

(75) Inventor: Chang Rok Moon, Ahnyang-si (KR)

(73) Assignee: Samsung Electronics Co., Ltd. (KR)

( * ) Notice: Subject to any disclaimer, the term of this patent is extended or adjusted under 35 U.S.C. 154(b) by 907 days.

(21) Appl. No.: 11/043,702

(22) Filed: Jan. 26, 2005

(65) Prior Publication Data

US 2005/0287479 A1    Dec. 29, 2005

(30) Foreign Application Priority Data

Jun. 28, 2004    (KR) ...................... 10-2004-0049001

(51) Int. Cl.
*G03F 7/00* (2006.01)
*H01L 31/00* (2006.01)
(52) U.S. Cl. ................. 430/290; 430/330; 257/437; 257/760; 438/69; 438/75
(58) Field of Classification Search ............... 438/69, 438/70, 75; 348/308, 340; 257/437, 69, 257/760; 430/330, 290
See application file for complete search history.

(56) References Cited

U.S. PATENT DOCUMENTS

| | | | |
|---|---|---|---|
| 6,030,852 A | 2/2000 | Sano et al. .............. | 438/69 |
| 6,221,687 B1 | 4/2001 | Abramovich ............. | 438/70 |
| 6,614,479 B1 | 9/2003 | Fukusho et al. .......... | 348/340 |
| 6,833,601 B2 | 12/2004 | Murakami | |

FOREIGN PATENT DOCUMENTS

| | | |
|---|---|---|
| JP | 2001-255401 | 9/2001 |
| JP | 03-224250 | 8/2003 |
| KR | 1020030066462 A | 8/2003 |

*Primary Examiner*—Thorl Chea
(74) *Attorney, Agent, or Firm*—Mills & Onello, LLP

(57) ABSTRACT

In a solid state imaging device, and a method of manufacture thereof, the efficiency of the transfer of available photons to the photo-receiving elements is increased beyond that which is currently available. Enhanced anti-reflection layer configurations, and methods of manufacture thereof, are provided that allow for such increased efficiency. They are applicable to contemporary imaging devices, such as charge-coupled devices (CCDs) and CMOS image sensors (CISs). In one embodiment, a photosensitive device is formed in a semiconductor substrate. The photosensitive device includes a photosensitive region. An anti-reflection layer comprising silicon oxynitride is formed on the photosensitive region. The silicon oxynitride layer is heat treated to increase a refractive index of the silicon oxynitride layer, and to thereby decrease reflectivity of incident light at the junction of the photosensitive region.

43 Claims, 13 Drawing Sheets

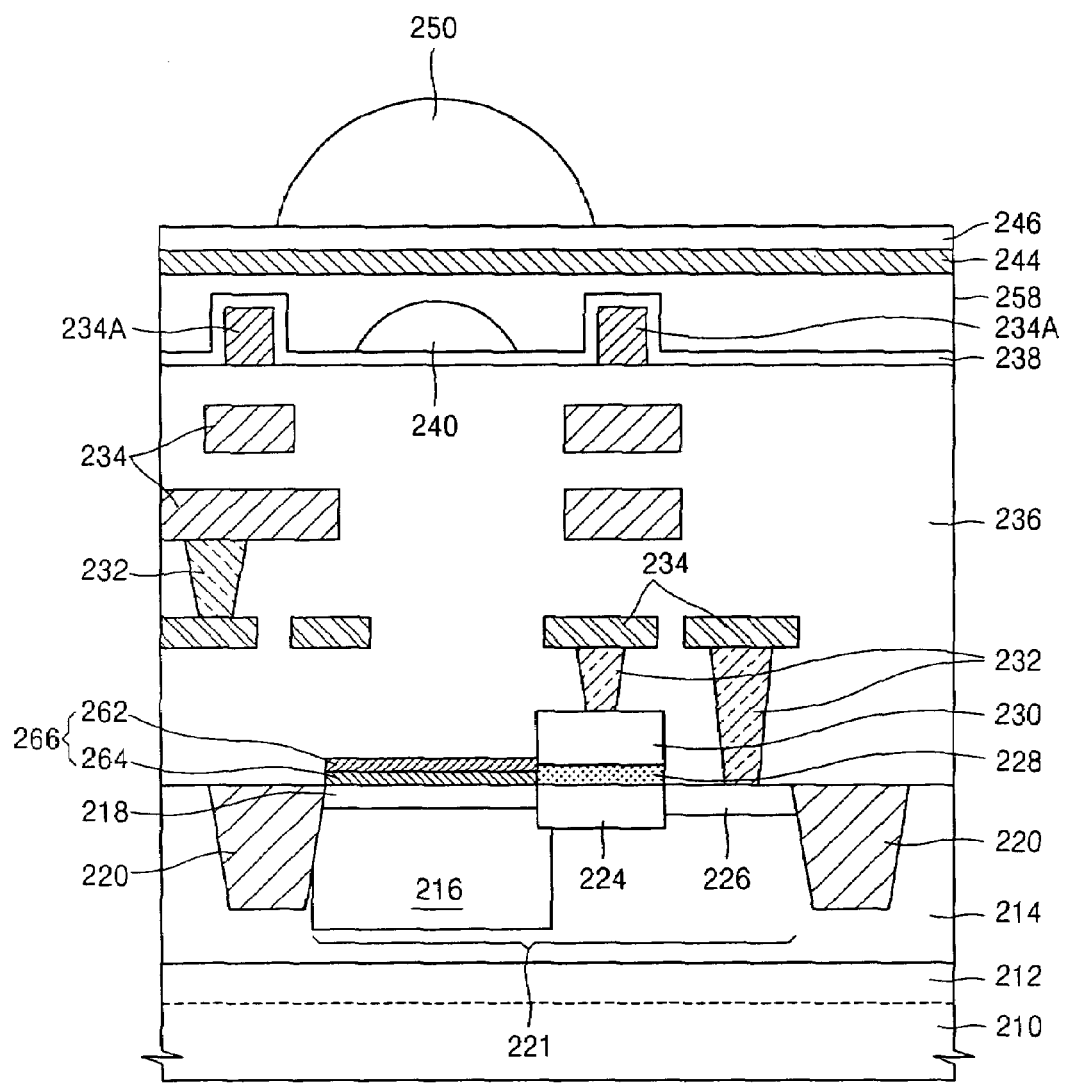

IMAGE SENSOR AND METHOD FOR MANUFACTURING THE SAME

RELATED APPLICATIONS

This application claims the benefit of Korean Patent Application No. 2004-49001, filed on Jun. 28, 2004, the disclosure of which is hereby incorporated herein by reference in its entirety.

BACKGROUND OF THE INVENTION

Solid-state imaging devices enjoy widespread use in contemporary imaging systems. Popular solid-state imaging devices include charge-coupled devices (CCD) and CMOS image sensors (CIS). Such devices are commonly employed in digital still cameras, digital video cameras, cellular telephones, and security systems.

The solid state imaging device converts transmitted light in the form of photon energy to electrical signals, and the electrical signals are converted to information that can be presented on display devices or otherwise processed by a computer system. CCD and CIS imaging devices include photo-reception elements such as photodiodes. Therefore, a significant factor in the efficiency and efficacy of such devices is the ability of the photo-reception elements to convert available photons to electrons. If the photon count being transmitted to the photo-reception elements is less than a threshold amount, the information presented on the display is adversely affected.

FIG. 1 is a sectional view of a conventional solid state imaging device. An n type photodiode device region 12 is formed in a substrate 10. A p+ doped region 14 is formed in the substrate 10 adjacent the photodiode device region 12. The p+ doped region 14 operates as a channel stop region, or insulative region, to prevent the flow of electrons between adjacent imaging devices on the substrate. A gate dielectric layer 16 comprising $SiO_2$ or oxide-nitride-oxide (ONO) and a polysilicon transfer gate layer 18 are then formed on the substrate 10 and patterned to expose the photodiode device region 12 and to thereby form a transfer gate structure at side regions of the photodiode device region 12.

An anti-reflection layer 30 is formed on the resulting structure. A cross-sectional close-up view of an anti-reflection layer is shown in FIG. 2. The anti-reflection layer 30 includes a first dielectric layer 31 comprising silicon dioxide and a second dielectric layer 33 comprising silicon nitride. The anti-reflection layer 30 reduces the number of reflected photons that are incident on the photodiode device 12, and therefore leads to improved efficiency in the photon-to-electrical energy transfer. Absent an anti-reflection layer 30, the reflectivity of photon energy at the surface of the photodiode device region 12 is on the order of 20%-30%. The presence of the conventional anti-reflection layer 30 shown in FIGS. 1 and 2 improves the reflectance level to a reduced amount on the order of 10%-20%. Returning to FIG. 1, a buffer layer 36 comprising silicon dioxide is formed over the top of the second dielectric layer 33 of the anti-reflection layer.

A protective shield layer 60 comprising tungsten is layered over the resulting structure, and is patterned to expose the anti-reflection layer 30 and buffer layer 36 in the photodiode device region 12. The protective shield layer 60 prevents photon energy from directly entering the transfer gate 18. A planarization layer 62 comprising silicon dioxide is then provided on the resulting structure and planarized, for example using chemical-mechanical polishing (CMP). A microlens 64 formed of resin is formed on the top of the planarization layer 62.

With the trend toward ever-increasing integration of solid state imaging devices, compact design and increased pixel density are of primary concern. With these goals in mind, the amount of light available at the light-receiving region of the device has been reduced, due to the reduced device size, thereby limiting device sensitivity. To improve sensitivity, the microlens 64 is provided to focus the incident light into the photodiode device region 12. At the same time, the anti-reflection layer 30 reduces the amount of reflected light and therefore enhances the capture of light energy at the photodiode device region 12.

Japanese patent publication JP 2003-224250 provides an example of a double-layered anti-reflection layer comprising a sequentially formed structure as follows: first silicon dioxide layer/first silicon nitride layer/second silicon dioxide layer/second silicon nitride layer. Each combined silicon dioxide/silicon nitride layer pair forms one anti-reflection layer. This configuration provides for further reduced reflectivity as compared to the single anti-reflection layer configuration of FIG. 2

FIG. 3 is an experimental graph illustrating reflectance as a function of the wavelength of light as a result of the application of first and second anti-reflection layers of the double-layered embodiment of JP 2003-224250. It can be seen in this graph that the application of the second anti-reflection layer operates to reduce reflectance in the visible light wavelength region of about 500-700 nm, as compared to the single reflection layer. However, the reflectance level of the double-layered configuration is actually higher than the single-layered configuration in approximately the 400 -500 nm wavelength region, and the double-layered configuration still demonstrates at least 4% reflectance in the visible wavelengths, an amount that can be limiting to device effectiveness as device integration continues.

SUMMARY OF THE INVENTION

The present invention is directed to a solid state imaging device, and a method of manufacture thereof, which increases the efficiency of the transfer of available photons to the photo-receiving elements beyond that which is currently available. The enhanced anti-reflection layer configurations, and methods of manufacture thereof, of the present invention, provide for such increased efficiency, and are applicable to contemporary imaging devices, such as charge-coupled devices (CCDs) and CMOS image sensors (CISs).

In a first aspect, the present invention is directed to a method of forming an imaging device. A photosensitive device is formed in a semiconductor substrate. The photosensitive device includes a photosensitive region. An anti-reflection layer is formed on the photosensitive region. The anti-reflection layer comprises a silicon oxynitride layer. The silicon oxynitride layer is heat treated to increase a refractive index of the silicon oxynitride layer.

In one embodiment, forming a photosensitive device comprises forming a charge-coupled device (CCD). In this case, forming a charge-coupled device comprises: forming a charge transfer region in the substrate adjacent the photosensitive region; and forming a transfer gate above the transfer region. In addition, an insulative capping layer is formed on the anti-refection layer, a shielding layer is formed on the capping layer between side portions of the anti-reflection layer and the transfer gate; and a planarization layer is formed on the shielding layer and capping layer.

In another embodiment, the method further comprises forming an inner lens in the planarization layer, forming a microlens on the planarization layer, and/or forming a color filter layer on the planarization layer.

In another embodiment, forming a photosensitive device comprises forming a CMOS image sensor (CIS) device, which, in turn, comprises: forming a charge transfer region in the substrate adjacent the photosensitive region; forming a floating diffusion region adjacent the charge transfer region opposite the photosensitive region; and forming a transfer gate above the charge transfer region. In addition, a dielectric layer is formed on the anti-reflection layer, metal interconnects are formed in the dielectric layer; and metal vias are formed through the dielectric layer to connect first and second metal interconnects with the transfer gate and with the floating diffusion region respectively. Forming the dielectric layer comprises forming multiple dielectric layers, and forming metal interconnects comprises forming metal interconnects at top portions of the multiple dielectric layers. The method further comprises forming an inner lens on the dielectric layer, forming a planarization layer on the inner lens and forming a microlens on the planarization layer, and/or forming a color filter layer on the planarization layer.

In another embodiment, the method further comprises forming a hole accumulation layer (HAL) at a top portion of the photosensitive region.

In another embodiment, forming the anti-reflection layer comprises: forming a first silicon dioxide layer on the photosensitive region, and forming the silicon oxynitride layer on the first silicon dioxide layer. Forming the first silicon dioxide layer comprises depositing the first silicon dioxide layer on the photosensitive region using one of a low pressure chemical vapor deposition (LPCVD) process and an Atomic Layer Deposition (ALD) process. Forming the silicon oxynitride layer comprises depositing the silicon oxynitride layer on the first silicon dioxide layer using plasma enhanced chemical vapor deposition (PECVD). Forming the silicon oxynitride layer comprises depositing the silicon oxynitride layer using plasma enhanced chemical vapor deposition (PECVD) to a thickness of about 20 to 60 nm.

In another embodiment, forming the anti-reflection layer further comprises: forming a second silicon dioxide layer on the silicon oxynitride layer and forming a silicon nitride layer on the second silicon dioxide layer. Forming the second silicon dioxide layer comprises depositing the second silicon dioxide layer on the photosensitive region using a chemical vapor deposition (CVD) process, and forming the silicon nitride layer comprises depositing the silicon nitride layer on the second silicon dioxide layer using a CVD process that uses source gases of $SiH_4$, $N_2O$, and/or $NH_3$ in an environment of nitrogen.

Heat treating the silicon oxynitride layer increases the refractive index of the silicon oxynitride layer to an amount ranging between about 2.3 and 3.0.

In another embodiment, the method further comprises patterning the anti-reflection layer in a region above the photosensitive layer by providing a photoresist layer on the anti-reflection layer; patterning the photoresist layer above the photosensitive region; and removing the silicon oxynitride layer of the anti-reflection layer using the patterned photoresist layer as a mask. Alternatively, patterning the anti-reflection layer comprises: providing a hard mask layer on the anti-reflection layer; patterning the hard mask layer above the photosensitive region; and removing the silicon oxynitride layer of the anti-reflection layer using the patterned hard mask layer as a mask.

Removing the silicon oxynitride layer of the anti-reflection layer comprises removing the silicon oxynitride layer using an HF solution.

Forming the anti-reflection layer comprising the silicon oxynitride layer comprises forming the silicon oxynitride layer using plasma-based chemical vapor deposition (CVD). In one embodiment, the plasma-based chemical vapor deposition comprises plasma enhanced chemical vapor deposition (PECVD). Heat treating the silicon oxynitride layer increases the refractive index of the silicon oxynitride layer to an amount ranging between about 2.3 and 3.0. Heat treating the silicon oxynitride layer comprises heat treating at a temperature greater than about 600 C, and/or for a time duration ranging between about 30 and 360 minutes.

The heat treating of the silicon oxynitride layer increases the refractive index of the silicon oxynitride layer to an amount ranging between about 2.3 and 3.0. Heat treating of the silicon oxynitride layer can be performed immediately following formation of the silicon oxynitride layer, or during further processing of the imaging device.

In another aspect, the present invention is directed to a method of forming an imaging device. A photosensitive device is formed in a semiconductor substrate; the photosensitive device including a photosensitive region. An anti-reflection layer is formed on the photosensitive region that reduces the reflectivity of photon energy at the photosensitive device. The anti-reflection layer includes a silicon oxynitride layer and has a refractive index ranging between about 2.3 and 3.0.

In one embodiment, forming the anti-reflection layer comprises: forming the anti-reflection layer proximal to the photosensitive device so that the anti reflection layer has a refractive index of about 2.0; and heat treating the silicon oxynitride layer to increase the refractive index of the silicon oxynitride layer to range between about 2.3 and 3.0.

In another aspect, the present invention is directed to a method of forming a semiconductor image sensor. A photosensitive device including a photosensitive region is formed in a semiconductor substrate. An anti-reflection layer is formed on and proximal to the photosensitive region for reducing reflection at a top interface of the photosensitive region. The anti-reflection layer includes a silicon oxynitride layer.

In one embodiment, forming the anti-reflection layer comprises forming the anti-reflection layer to have a refractive index ranging between about 2.3 and 3.0 by: forming the anti-reflection layer proximal to the photosensitive device so that the anti reflection layer has a refractive index of about 2.0; and heat treating the silicon oxynitride layer to increase the refractive index of the silicon oxynitride layer to range between about 2.3 and 3.0.

In another aspect, the present invention is directed to a method of forming a semiconductor image sensor. A photosensitive device including a photosensitive region is formed in a semiconductor substrate. An anti-reflection layer is formed on and proximal to the photosensitive region for reducing reflection at a top interface of the photosensitive region, the anti-reflection layer having a refractive index ranging between about 2.3 and 3.0.

In one embodiment, forming the anti-reflection layer comprises forming the anti-reflection layer to include a silicon oxynitride layer. The anti-reflection layer is formed proximal to the photosensitive device so that the anti reflection layer has a refractive index of about 2.0; and the silicon oxynitride layer is heat treated to increase the refractive index of the silicon oxynitride layer to range between about 2.3 and 3.0.

In another aspect of the present invention is directed to a semiconductor image sensor. The sensor includes a photosensitive device including a photosensitive region formed in a semiconductor substrate; and an anti-reflection layer proximal to the photosensitive region for reducing reflection at a top interface of the photosensitive region. The anti-reflection layer includes a silicon oxynitride layer.

In one embodiment, the anti-reflection layer has a refractive index ranging between about 2.3 and 3.0. The silicon oxynitride layer is heat treated to increase the refractive index of the silicon oxynitride layer from an initial lower amount to an amount ranging between about 2.3 and 3.0. The heat treatment is conducted at a temperature greater than about 600 C, and for a time duration ranging between about 30 and 360 minutes.

In one embodiment, the photosensitive device comprises a charge-coupled device (CCD). The charge-coupled device comprises: a charge transfer region in the substrate adjacent the photosensitive region; and a transfer gate above the transfer region; and the semiconductor image sensor further comprises: an insulative capping layer on the anti-refection layer; a shielding layer on the capping layer between side portions of the anti-reflection layer and the transfer gate; and a planarization layer on the shielding layer and capping layer.

The device further optionally includes an inner lens formed in the planarization layer, a microlens on the planarization layer, and/or a color filter layer on the planarization layer.

In one embodiment, the photosensitive device comprises a CMOS image sensor (CIS) device. The CMOS image sensor (CIS) device comprises: a charge transfer region in the substrate adjacent the photosensitive region; a floating diffusion region adjacent the charge transfer region opposite the photosensitive region; and a transfer gate above the charge transfer region; and the semiconductor image sensor further comprises: a dielectric layer on the anti-refection layer; metal interconnects in the dielectric layer; and metal vias through the dielectric layer to connect first and second metal interconnects with the transfer gate and with the floating diffusion region respectively. The dielectric layer comprises multiple dielectric layers, and the metal interconnects are at top portions of the multiple dielectric layers. The device optionally further includes an inner lens on the dielectric layer, a planarization layer on the inner lens and a microlens on the planarization layer, and/or a color filter layer on the planarization layer.

In one embodiment, a hole accumulation layer (HAL) is provided at a top portion of the photosensitive region.

In one embodiment, the anti-reflection layer comprises: a first silicon dioxide layer; and a silicon oxynitride layer on the first silicon dioxide layer. The silicon oxynitride layer is deposited on the first silicon dioxide layer using plasma enhanced chemical vapor deposition (PECVD). The anti-reflection layer may optionally further comprise: a second silicon dioxide layer on the silicon oxynitride layer; and a silicon nitride layer on the second silicon dioxide layer.

In another aspect, the present invention is directed to a semiconductor image sensor. The sensor includes a photosensitive device including a photosensitive region formed in a semiconductor substrate. An anti-reflection layer is provided proximal to the photosensitive region for reducing reflection at a top interface of the photosensitive region. The anti-reflection layer has a refractive index ranging between about 2.3 and 3.0.

In one embodiment, the anti-reflection layer includes a silicon oxynitride layer that is heat treated to increase the refractive index of the silicon oxynitride layer.

In another aspect, the present invention is directed to an anti-reflection layer for use in a semiconductor imaging device. The anti-reflection layer includes a first silicon dioxide layer and a silicon oxynitride layer on the first silicon dioxide layer. The silicon oxynitride layer is heat treated such that the silicon oxynitride layer has a refractive index ranging between about 2.3 and 3.0.

In one embodiment, the anti-reflection layer further comprises: a second silicon dioxide layer on the silicon oxynitride layer; and a silicon nitride layer on the second silicon dioxide layer.

In another aspect, the present invention is directed to a charge-coupled device (CCD) image sensor. The sensor comprises a photosensitive region formed in a semiconductor substrate. A hole-accumulation layer (HAL) is formed at a top portion of the photosensitive region. A charge transfer region is provided in the substrate adjacent the photosensitive region. A transfer gate is above the transfer region. An anti-reflection layer is above the photosensitive region for reducing reflection at a top interface of the hole-accumulation layer (HAL). The anti-reflection layer includes a silicon oxynitride layer. An insulative capping layer is on the anti-refection layer. A shielding layer is on the capping layer between side portions of the anti-reflection layer and the transfer gate.

In another aspect, the present invention is directed to a CMOS image sensor (CIS). A photosensitive region is formed in a semiconductor substrate. A hole-accumulation layer (HAL). is formed at a top portion of the photosensitive region. A charge transfer region is in the substrate adjacent the photosensitive region. A floating diffusion region is provided adjacent the charge transfer region opposite the photosensitive region. A transfer gate is above the transfer region. An anti-reflection layer is above the photosensitive region for reducing reflection at a top interface of the hole-accumulation layer (HAL). The anti-reflection layer includes a silicon oxynitride layer. A dielectric layer is on the anti-refection layer. Metal interconnects are provided in the dielectric layer. Metal vias are provided through the dielectric layer to connect first and second metal interconnects with the transfer gate and with the floating diffusion region respectively.

The dielectric layer comprises multiple dielectric layers, and the metal interconnects are at top portions of the multiple dielectric layers. The CIS device optionally further includes an inner lens on the dielectric layer, a planarization layer on the inner lens and a microlens on the planarization layer, or a color filter layer on the planarization layer.

In another aspect, the present invention is directed to a semiconductor image sensor. A photosensitive device includes a photosensitive region formed in a semiconductor substrate. An anti-reflection layer is provided proximal to the photosensitive region for reducing reflection at a top interface of the photosensitive region. The anti-reflection layer comprises a first silicon dioxide layer; a silicon oxynitride layer on the first silicon dioxide layer; a second silicon dioxide layer on the silicon oxynitride layer; and a silicon nitride layer on the second silicon dioxide layer.

In one embodiment, the silicon oxynitride layer is deposited on the first silicon dioxide layer using plasma enhanced chemical vapor deposition (PECVD). The silicon oxynitride layer is heat treated to increase the refractive index of the silicon oxynitride layer from an initial lower amount to an amount ranging between about 2.3 and 3.0.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 10 is a cross-sectional view of an embodiment of a CMOS image sensor (CIS) in accordance with the present invention.

DETAILED DESCRIPTION OF PREFERRED EMBODIMENTS

Figure 4:
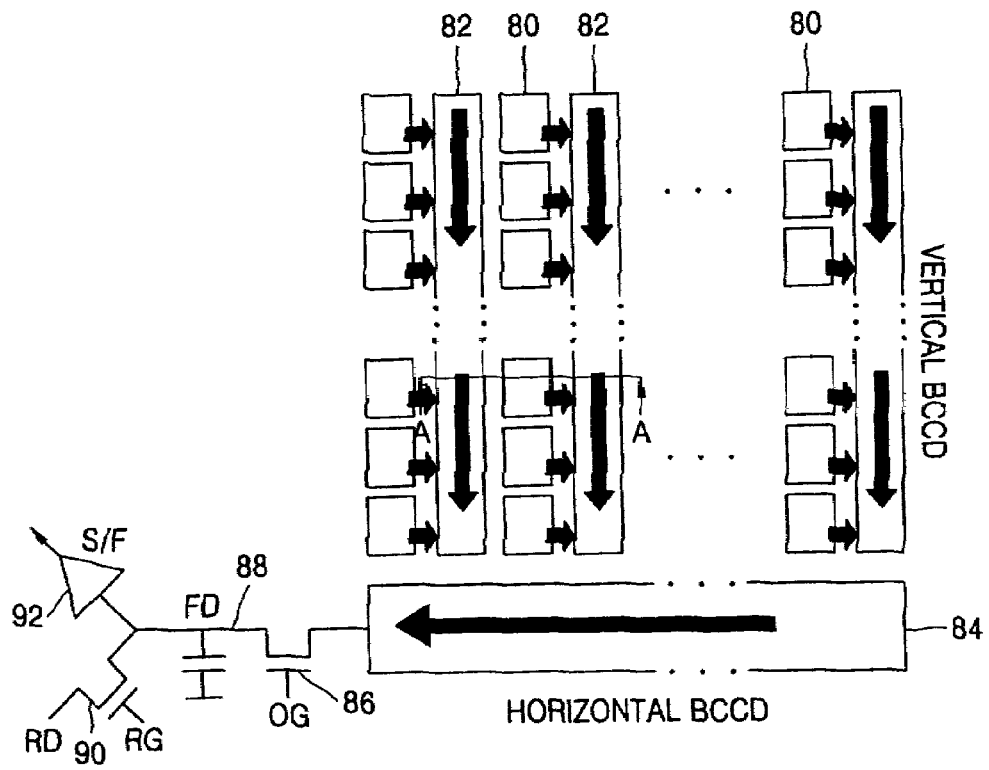
FIG. 4 is a conceptual representation of a charge coupled device (CCD).

FIG. 4 is a conceptual representation of a charge coupled device (CCD). A CCD comprises an array of photodiode pixels 80 at which photon energy is captured and accumulated. The captured charge is converted to electrical energy at adjacent vertical buried charge-coupled devices 82, and transferred from the vertical buried charge coupled devices 82 to a horizontal buried charge coupled device 84. The charge is then transferred from the horizontal buried charge coupled device 84 through an output gate OG 86 to a floating diffusion FD unit 88, where the charge is accumulated. The accumulated charge is periodically transferred through a source follower buffer S/F 92 to processing circuitry. Following transfer, a reset gate RG 90 is activated to drain the accumulated charge to a reset drain RD. An advantage of the CCD array lies in that no transmission or signal lines are needed at the pixel level to retrieve the incident energy from the individual pixels.

Figure 5:
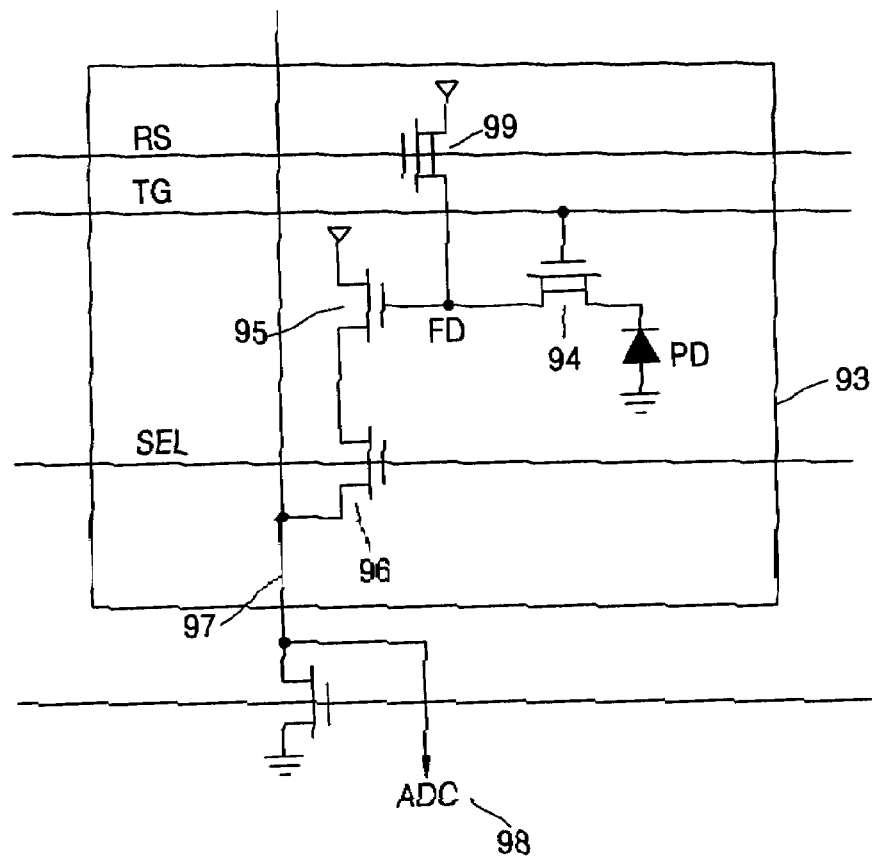
FIG. 5 is a schematic representation of a CMOS image sensor (CIS).

A CMOS image sensor (CIS), on the other hand, as represented schematically in FIG. 5, includes a plurality of transistors for each device pixel. Each pixel 93 of the array operates as an active pixel sensor (APS), and includes a photodiode PD, at which the incident light energy is captured and converted to electrical energy. A transfer gate 94 receives an activation signal via a transfer gate line TG, and transfers the electrical information received at the photodiode PD to a floating diffusion node FD. A source follower transistor 95 and corresponding current selection transistor 96, activated by select line SEL, transfer the energy stored at the floating diffusion node FD to an output line 97, and the output analog electrical signal is provided to an analog-to-digital converter ADC 98, where the signal is converted for further digital processing. Following a read, the floating diffusion region FD is reset by reset transistor 99, which is activated by reset line RS. While the CIS array configuration requires that signal lines be routed to the various transistors at each pixel 93, the CIS configuration offers the advantages of relatively low power consumption and enhanced circuit integration over the CCD configuration, as the CIS configuration includes both APS blocks and image signal processing circuitry in a common chip.

Figure 6A:
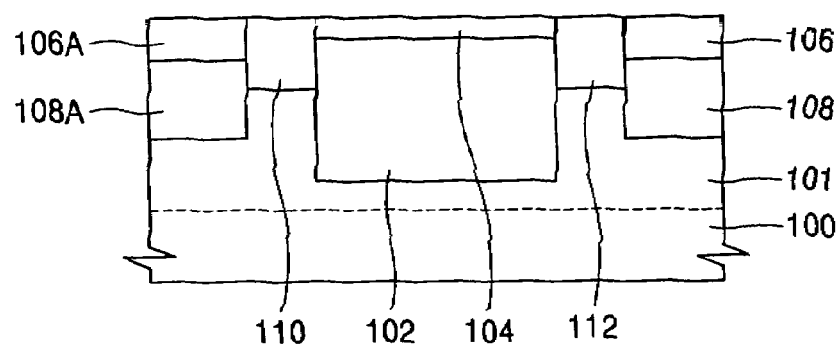
FIGS. 6A-6F are cross-sectional views of a first embodiment of a process for forming an image sensor in accordance with the present invention.

FIGS. 6A-6F are cross-sectional views of a first embodiment of a process for forming an image sensor in accordance with the present invention. In the drawings of FIGS. 6A to 6F, a CCD device image sensor is depicted; however, the principles of the present invention apply equally well to CIS-type image sensors, and other forms of image sensors, and methods of fabrication thereof, FIG. 6A is a cross-sectional view of the CCD device of FIG. 4 taken along section line A-A. With reference to FIG. 6A, a p type well 101 is formed in a region of a semiconductor substrate 100, for example a silicon-based substrate. The p type well 101 is formed by implanting boron B at an energy level of 3 MeV, and a dopant concentration of $2E^{11}/cm^2$. A photon-receiving region 102 is formed in the p type well 101 by implanting arsenic As at an energy level of 800 eV, and a dopant concentration of $2E^{11}/cm^2$. A p+ type channel stop region 110 is formed at a first side of the photon-receiving region 102 by implanting a p type dopant. A p type transfer region 112 is formed at a second side of the photon-receiving region 102 by implanting a p type dopant. The doping concentration in the p+ type channel region 110 is higher than the doping concentration in the p type transfer region 112.

A p type buffer region 108 is formed at a side of the p type transfer region 112 opposite the photon-receiving region 102 by implanting a p type dopant. An n type transfer region 106 is formed on the p type buffer region 108 by implanting n type dopant. A hole accumulation layer (HAL) 104 is formed on the photon-receiving region 102 by implanting a p type dopant.

During operation, the hole accumulation layer (HAL) 104 operates as a photodiode to prevent the "dark current effect" from occurring in the photon-receiving region 102. Under this phenomenon, remanent electrons that are trapped at the top surface of the substrate or the gate dielectric layer (see FIG. 6B, below) migrate into the photon-receiving region 102. This causes a false reading of the photon energy, even in the absence of photon energy incident on the device. The HAL mitigates or prevents the occurrence of this phenomenon.

Electrons captured at the photon-receiving region 102 migrate to the corresponding n type transfer region 106, also referred to in the art as the "charge-coupled device". The p+ type channel stop region 110 operates to provide a potential barrier which prevents electrons from migrating in a lateral direction from the photon-receiving region 102 to the n type transfer region 106A that forms a charge-coupled device of an adjacent pixel.

Figure 6B:
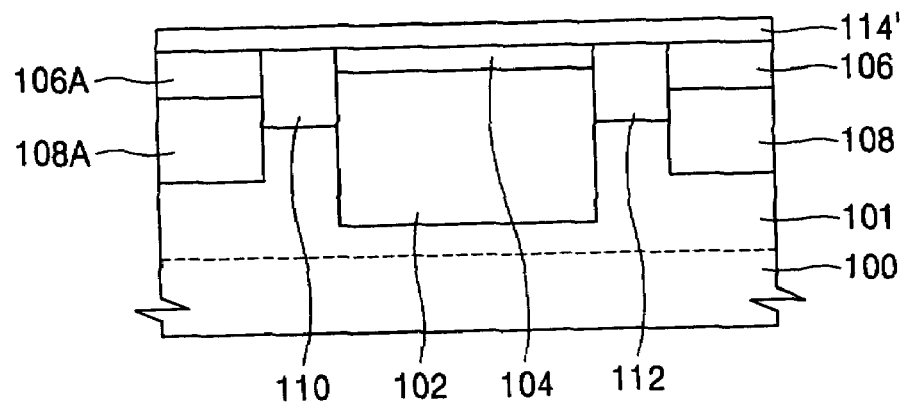

Referring to FIG. 6B, a gate dielectric layer 114' is provided on the resulting structure. The gate dielectric layer comprises, for example, a silicon dioxide $SiO_2$ or a $SiO_2/Si_2N_3/SiO_2$ (ONO) sequentially-stacked layer.

Figure 6C:
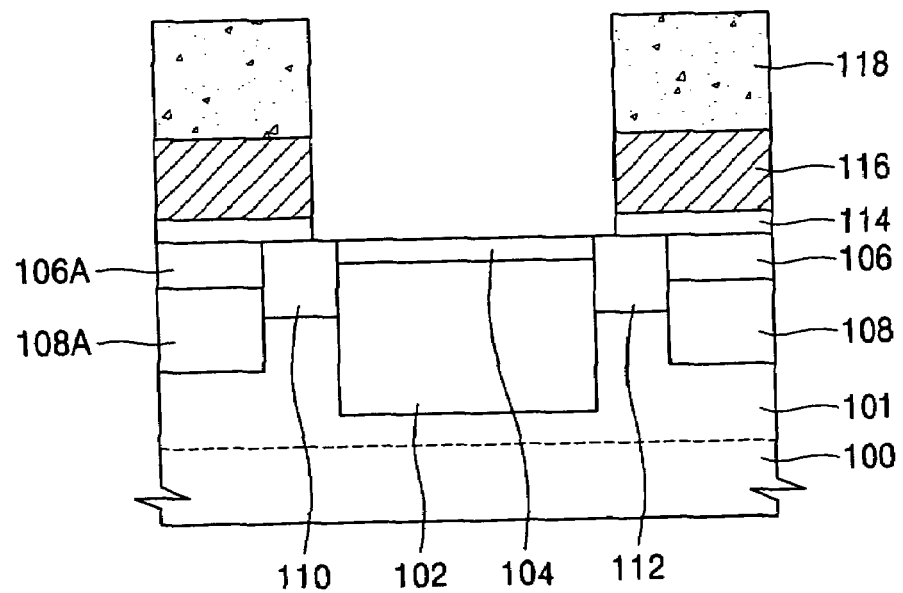

Referring to FIG. 6C, an electrode layer comprising polysilicon material and a photoresist layer are next sequentially formed on the gate dielectric layer 114'. The photoresist layer is patterned, and the underlying layers are etched using the patterned photoresist layer 118 as an etch mask to expose the underlying silicon substrate in the photon-receiving region 102 and the hole accumulation layer (HAL) 104. In this manner, a patterned gate dielectric 114 and an electrode 116 of a vertical buried charge coupled device (VBCCD) are formed.

Figure 6D:
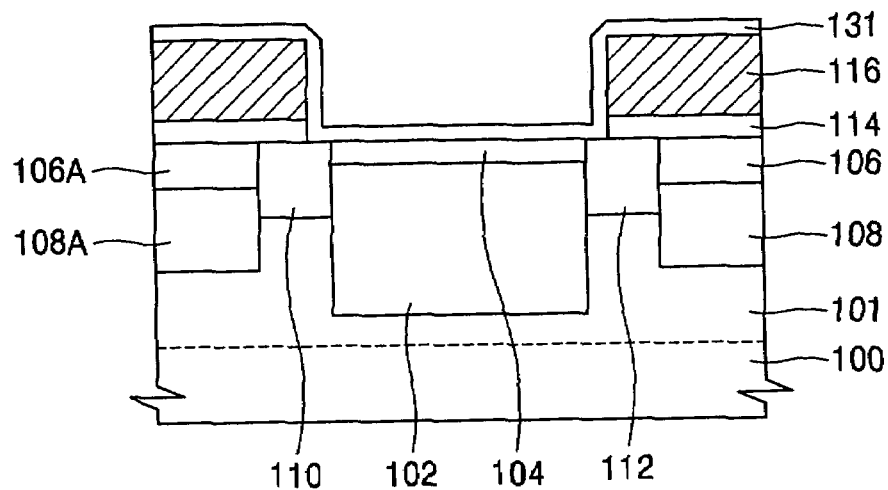

Referring to FIG. 6D, the patterned photoresist layer 118 is removed, and a silicon dioxide layer 131 is formed on the resulting structure, including the hole accumulation layer (HAL) 104 on the photon-receiving region 102. The silicon dioxide layer 131 is formed, for example, using low-pressure chemical vapor deposition (LPCVD) or atomic layer deposition (ALD) to a thickness ranging between about 5-50 nm. The silicon dioxide layer 131 operates as a buffer layer to relieve mechanical stress between the surface of the HAL region 104 and a subsequent layer to be formed on the silicon dioxide layer 131, and also prevents surface degradation of the HAL region 104 during subsequent fabrication processes, which is important for minimizing the dark current effect. The refractive index n1 and the thickness of the silicon dioxide layer 131 are respectively on the order of about 1.4-1.5 and about 5-50 nm.

Figure 6E:
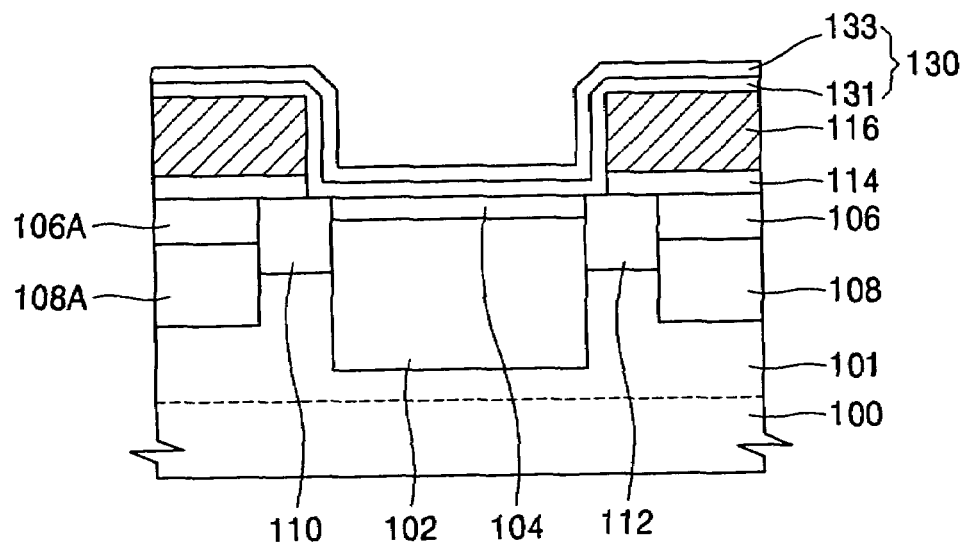

Referring to FIG. 6E, a silicon oxynitride ($Si_xO_yN_z$, or SiON) layer 133 is next uniformly deposited on the silicon dioxide layer 131. The silicon oxynitride layer 133 is formed by plasma enhanced chemical vapor deposition (PECVD) using silane ($SiH_4$), $NH_3$, $N_2O$, and $N_2$ gases. At the time of deposit, the silicon oxynitride layer 133 has a refractive index value of about 2.0. The silicon oxynitride layer 133 is then heat treated or annealed at a temperature greater than 600 C for about 30-360 minutes in an inert gas environment. The thickness of the resulting silicon oxynitride layer 133 is on the order of about 20-60 nm. The heat treatment may be applied immediately following deposit of the silicon oxynitride layer 133, or, optionally, may be applied during processing of subsequent device layers.

As a result of the above heat treatment, the refractive index n2 of the silicon oxynitride layer 133 is increased from about 2.0 to about 2.3-3.0, preferably to 2.4-2.6. The refractive index n3 of the hole accumulation layer 104 is about 4.5. The refractive index of a material layer has a direct effect on the resulting reflectivity of the layer, in addition to other factors such as layer thickness and the like. The refractive indices of adjacent layers should be matched as closely as possible to ensure minimization of reflection at their interface. Together, the silicon dioxide layer 131 and silicon oxynitride layer 133 operate as an anti-reflection layer for the imaging device of the present invention. Formation of the silicon oxynitride layer 133 by PECVD is preferred as it has been demonstrated that the properties of the silicon oxynitride layer deposited in this manner are such that the refractive index of the layer can be raised from a value about 2.0, initially after deposit, to a value in the range of 2.3-3.0, following the heat treatment. Raising the value of the refractive index decreases the resulting reflectivity of the layer. Such an ability to increase the refractive index following heat treatment was found experimentally to be absent in a silicon oxynitride layer deposited using low-pressure chemical vapor deposition (LPCVD).

Figure 6F:
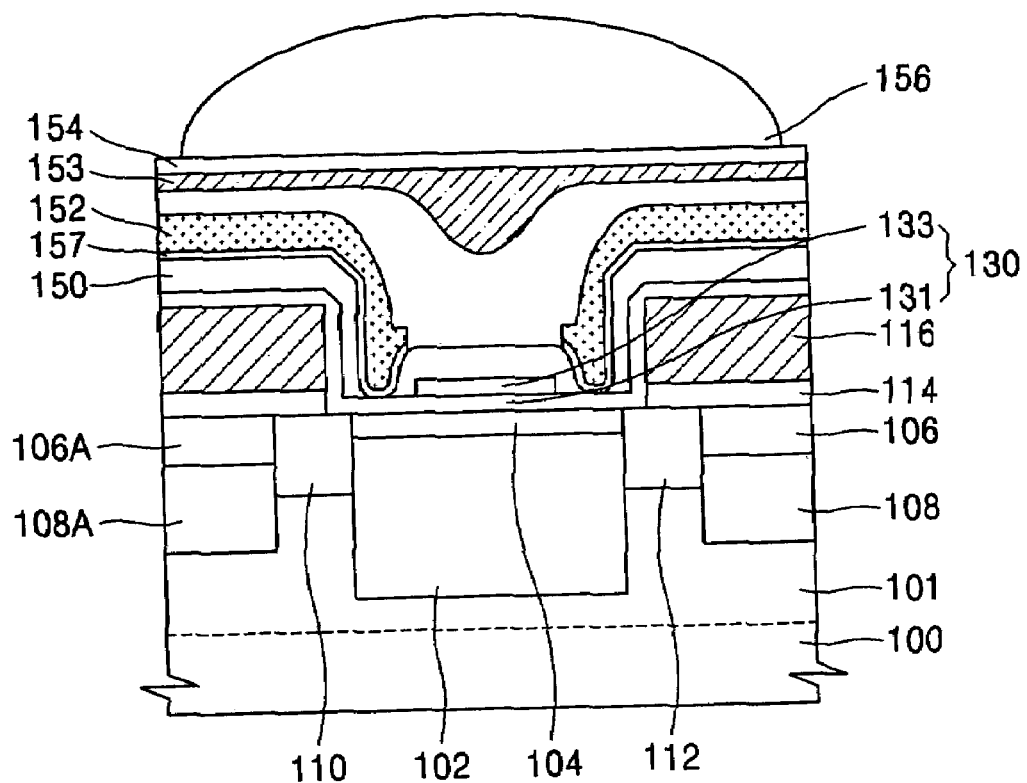

With reference to FIG. 6F, the silicon oxynitride layer 133 of the anti-reflection layer 130 is patterned in a region above the photon-receiving region 102. A capping layer 150, comprising for example silicon dioxide $SiO_2$, is formed on the resulting structure including the patterned anti-reflection layer 130. A dielectric layer 157 such as $SiO_2$ or $Si_3N_4$ is formed on the resulting structure. A shielding layer 152 is then formed on the resulting structure, and the shielding layer 152 is patterned to expose the capping layer 150 above the patterned anti-reflection layer 130. Following this, a planarization layer 154 comprising silicon dioxide $SiO_2$, or resin, is formed, and a lens 156 comprising resin is formed on the resulting structure according to conventional techniques. An optional inner lens structure 153 comprising $SiO_2$, $Si_3N_4$, or resin may be formed in the planarization layer 154, for example according to the techniques disclosed in U.S. Pat. Nos. 6,614,479 and 6,030,852, incorporated herein by reference, for the purpose of improving the focusing of incident photons into the photon-receiving region 102. The resulting indices of refraction of the various layers are as follows: hole accumulation layer 104—4.5; silicon dioxide layer 131—1.45; silicon oxynitride layer 133—2.5; capping layer 150—2.0; and planarization layer 154—1.5.

In this manner, the silicon oxynitride layer 133 is deposited, and, as a result of the above-described heat treatment, the refractive index of the silicon oxynitride layer 133 is raised to a level that is greater than that of the conventional silicon nitride layer, which has a refractive index of about 2. This results in a decrease in reflectivity of the resulting anti-reflection layer 130 including the silicon oxynitride layer 133, in turn resulting in improved photon capture and more efficient optical-to-electrical energy transfer at the pixel level.

FIGS. 7A-7E are cross-sectional views of a second embodiment of a process for forming an image sensor in accordance with the present invention.

Figure 7A:
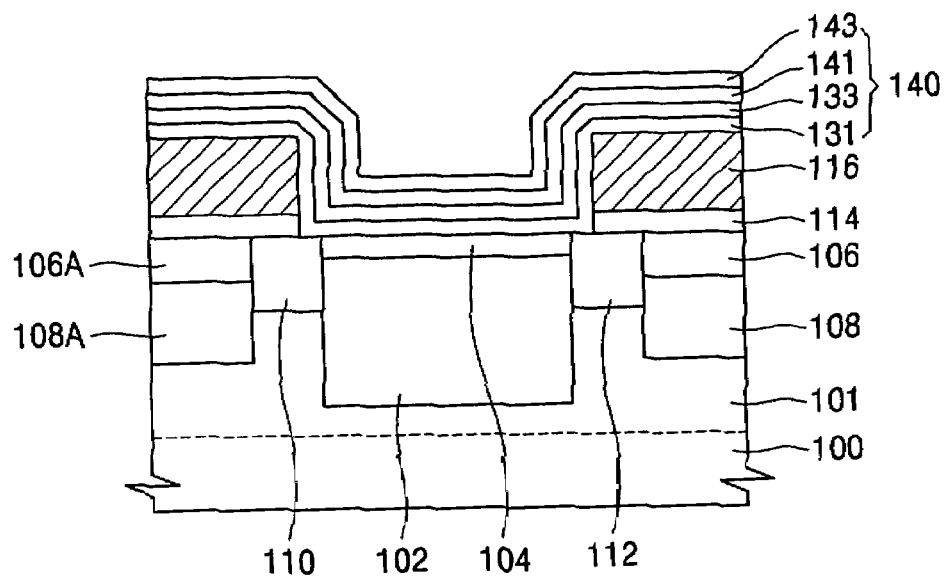
FIGS. 7A-7E are cross-sectional views of a second embodiment of a process for forming an image sensor in accordance with the present invention.

FIG. 7A is a cross-sectional view of the CCD device of FIG. 4 taken along section line A-A in accordance with a second embodiment of the present invention. In the same manner as the embodiment shown in FIG. 6E, the solid state imaging device of FIG. 7A includes a first silicon dioxide layer 131 and a first silicon oxynitride layer 133. However, prior to patterning of the silicon oxynitride layer 133 as shown in FIG. 6F of the first embodiment, the present second embodiment includes a second silicon dioxide layer 141 and a silicon nitride layer 143 that are sequentially formed on the silicon oxynitride layer 133. Therefore, in this embodiment, the anti-reflection layer 140 includes the first silicon dioxide layer 131, the silicon oxynitride layer 133, the second silicon dioxide layer 141, and the silicon nitride layer 143, applied sequentially. As in the first embodiment, the first silicon dioxide layer 131 of the second embodiment is formed, for example using low-pressure chemical vapor deposition (LPCVD) or atomic layer deposition (ALD) to a thickness ranging between about 5-50 nm. The silicon oxynitride layer 133 is formed by plasma enhanced chemical vapor deposition (PECVD), as described above to a thickness of about 20-60 nm. The second silicon dioxide layer 141 is applied by chemical vapor deposition (CVD) to a thickness of about 10-70 nm. The silicon nitride layer 143 is deposited on the resulting structure to a thickness of about 5-35 nm using a CVD process that uses source gases of $SiH_4$, $N_2O$, and/or $NH_3$ in an environment of nitrogen. As described above, the silicon oxynitride layer 133 is heat-treated at a temperature greater than 600 C for about 30-360 minutes in an inert gas environment. The heat treatment may be applied immediately following deposit of the silicon oxynitride layer 133, or during or following the deposit of subsequent layers, as described above. As a result of the heat treatment, the refractive index n2 of the silicon oxynitride layer 133 is increased from about 2.0 at the time of deposit to about 2.3-3.0, preferably to 2.4-2.6. The resulting refractive indices of the various layers are as follows: first silicon dioxide layer 131—1.4 to 1.5; silicon oxynitride layer 133, 2.3-3.0, preferably 2.4-2.6; second silicon dioxide layer 141, 1.4-1.5; and silicon nitride layer 143, 1.9-2.1.

Application of the second anti-reflection layer, comprising the second silicon dioxide layer 141 and the silicon nitride layer 143, operates to further reduce the reflectivity at the top surface of the substrate. An experimental example of the results obtained is provided below in conjunction with FIG. 9.

Figure 7B:
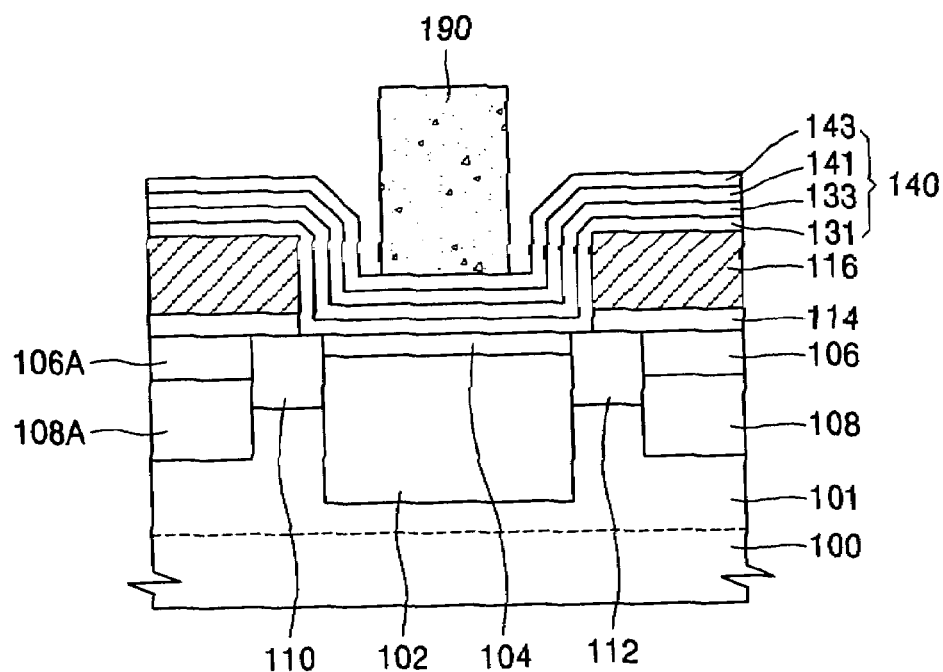

Referring to FIG. 7B, the resulting structure is coated with a photoresist layer that is patterned to form a photoresist pattern 190 on the anti-reflection layer 140 above the photon-receiving region 102 of the device. The photoresist pattern 190 is used to etch the underlying anti-reflection layer 140. A dry etch or wet etch process may be applied to remove the anti-reflection layer 140. In the wet-etch process, a solution of $H_3PO_4$ may be used for etching of the silicon nitride layer 143. A solution of HF may be used for etching of the second silicon dioxide layer 141, and the solution of HF may be used for etching of the silicon oxynitride layer 133.

Figure 7C:
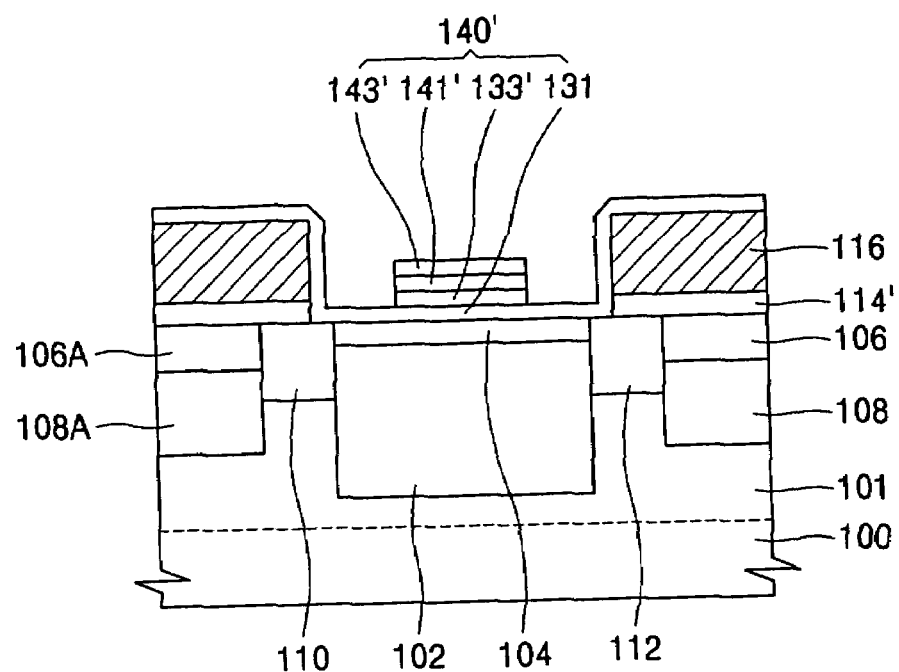

Referring to FIG. 7C, following the etch, the patterned anti-reflection layer 140' comprises a patterned silicon nitride layer 143', a patterned second silicon dioxide layer 141', a patterned silicon oxynitride layer 133', and the first silicon dioxide layer 131. The first silicon dioxide layer 131 remains intact during the etch process to serve as a protection layer to prevent surface damage to the hole accumulation layer (HAL) 104. Since the hole accumulation layer (HAL) 104 has a refractive index of about 4.5, the multiple layers of the anti-reflection layer 140' operate to gradually transition the change in refractive index between the hole accumulation layer 104 and upper layers, to thereby minimize reflectivity at the top surface of the photon-receiving region 102.

Figure 7D:
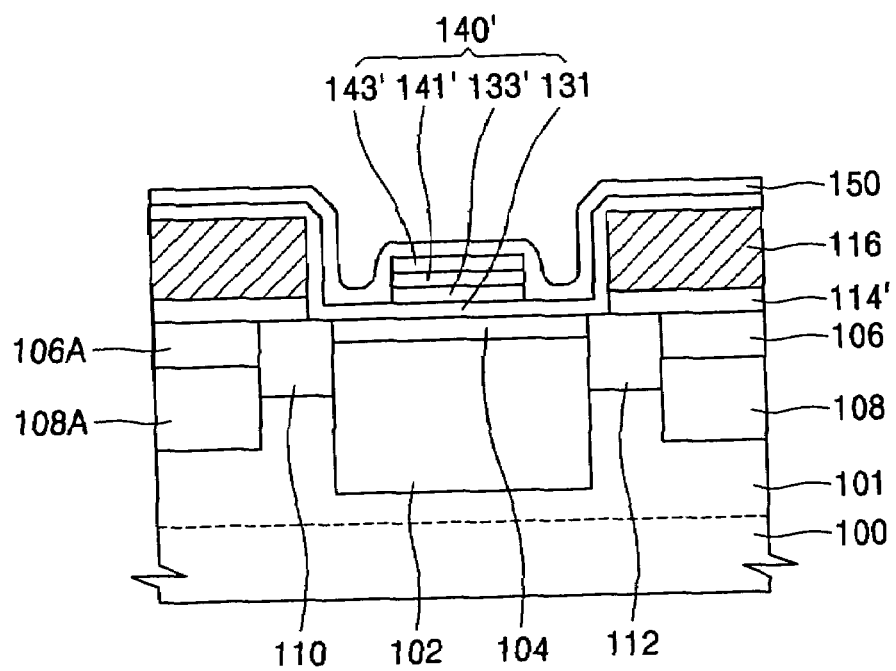

Referring to FIG. 7D, a capping layer 150, for example comprising silicon dioxide, is deposited using CVD on the anti-reflection layer 140'.

Figure 7E:
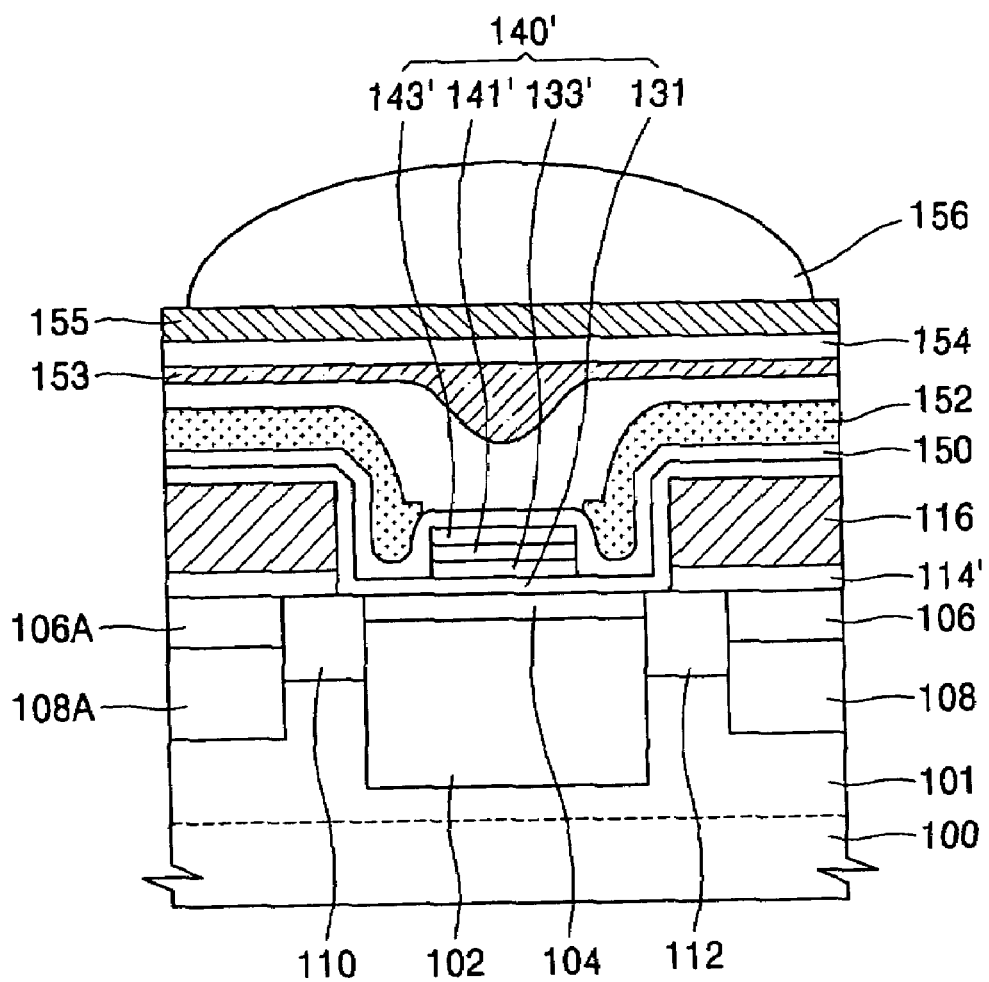

FIG. 7E is a cross-sectional illustration of the resulting solid-state imaging device. A shielding layer 152 comprising W or Al is applied to the resulting structure, as described above, for preventing photons from directly entering the vertical buried charge coupled device (VBCCD) 116. A planarization layer 154, for example comprising a transparent resin or a silicon dioxide layer is formed using a coating technique, and then planarized for serving as a base for the microlens 156. A microlens layer is formed for example of resin on the planarization layer 154, and then microlenses 156 are formed according to conventional techniques. An optional color filter 155 may be inserted between the planarization layer 154 and the microlens 156. In one embodiment, the color filter 155 layer comprises a photoresist material layer having a color pigment. The color filter 155 may likewise be applied to the embodiment shown and described above with reference to FIG. 6F. In addition, an optional inner lens 153 may be provided in the planarization layer 154, as described above.

Figure 8A:
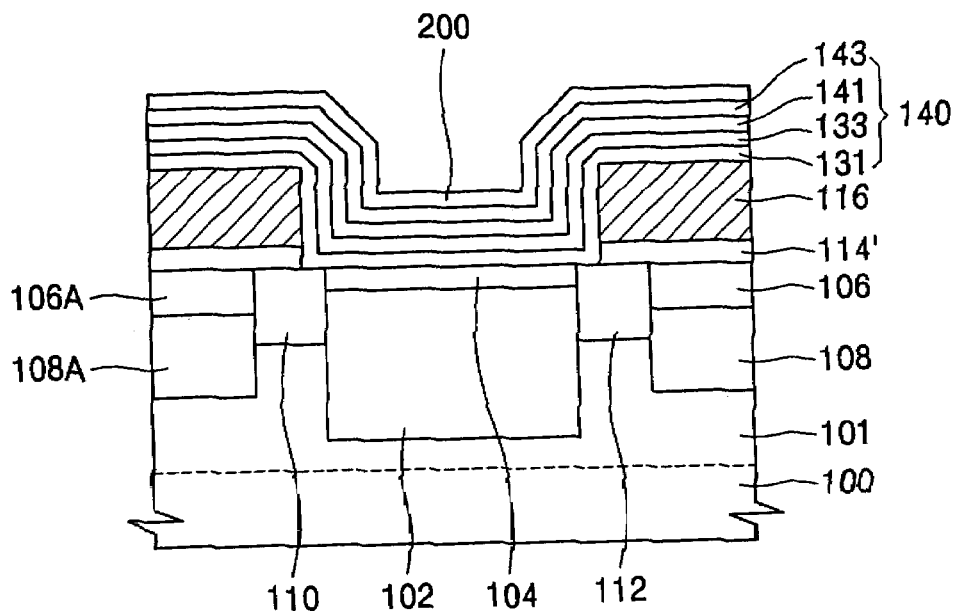
FIGS. 8A-8D are cross-sectional views of a third embodiment of a process for forming an image sensor in accordance with the present invention.

FIGS. 8A-8D are cross-sectional views of a third embodiment of a process for forming an image sensor in accordance with the present invention FIG. 8A is a cross-sectional illustration of a solid state imaging device having a multiple layered anti-reflection layer 140 applied in a manner similar to that described above with reference to FIG. 7A. In this embodiment, a hard mask 200, for example comprising silicon dioxide, is layered on the anti-reflection layer 140.

Figure 8B:
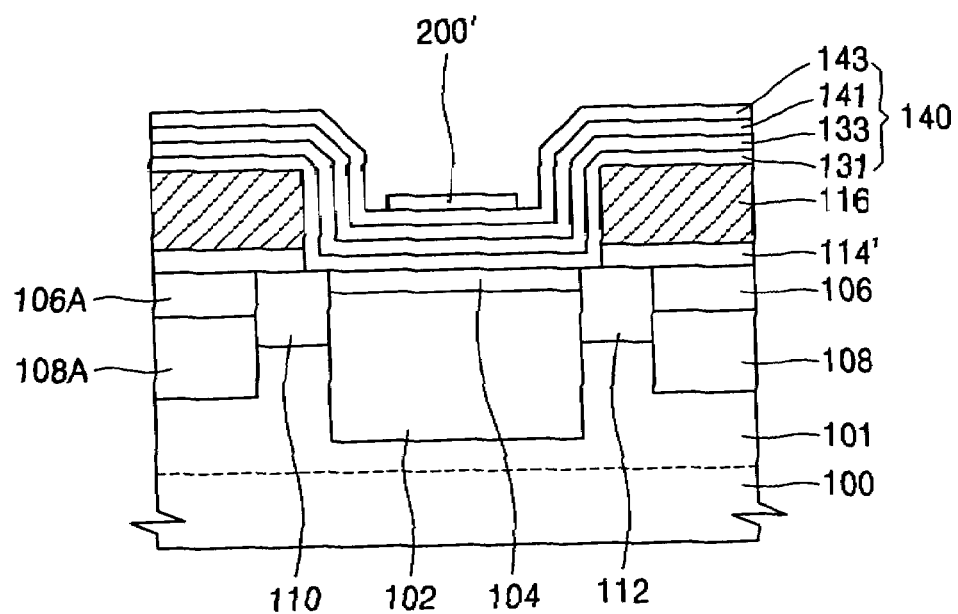

Referring to FIG. 8B, the hard mask 200 is patterned to form a patterned hard mask 200' according to conventional photolithographic techniques in a region above the photon-receiving region 102 as shown.

Figure 8C:
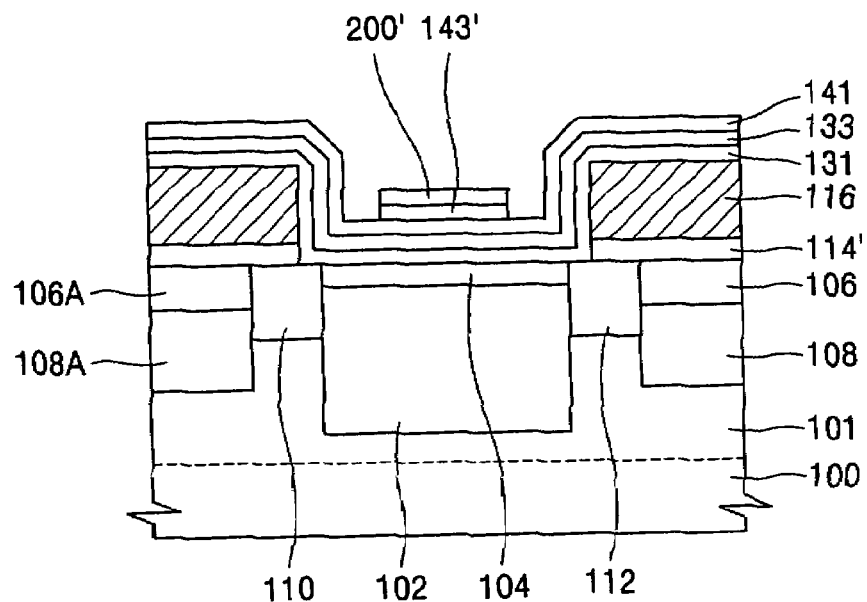

Referring to FIG. 8C, the silicon nitride layer 143' is etched in a wet etch process using phosphoric acid ($H_3PO_4$) as an etch solution.

Figure 8D:
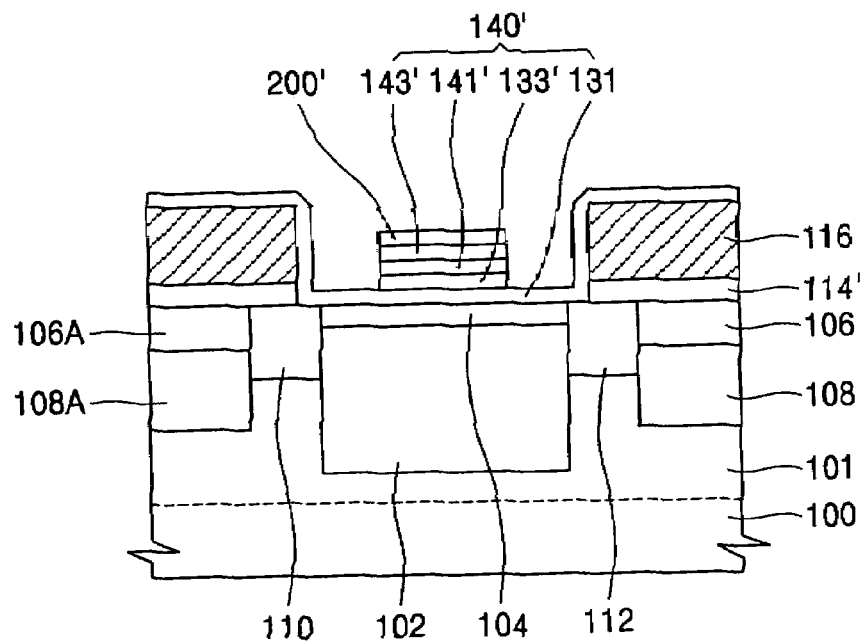

Referring to FIG. 8D, the second silicon dioxide layer 141' and the silicon oxynitride layer 133' are subsequently etched using a wet etching process utilizing hydrofluoric acid (HF) as an etch solution. In this manner, the anti-reflection layer 140' is patterned using a patterned hard mask 200' as an etch mask. Following this, subsequent layers are applied, as shown above in FIGS. 6F and 7E, for further fabrication of the device.

Figure 1:
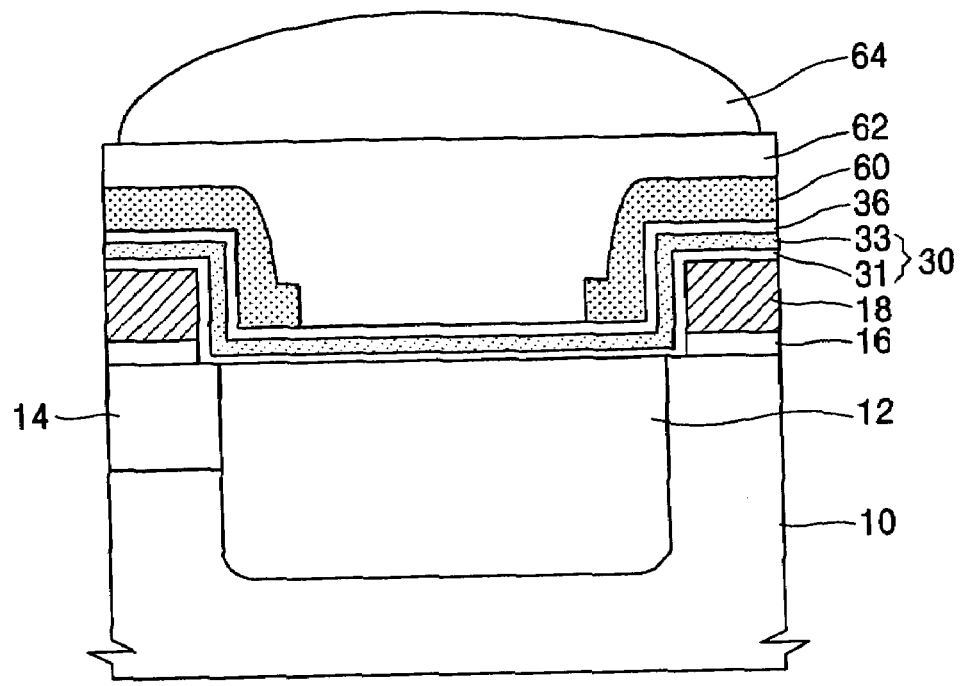
FIG. 1 is a sectional view of a conventional imaging device.
Figure 2:
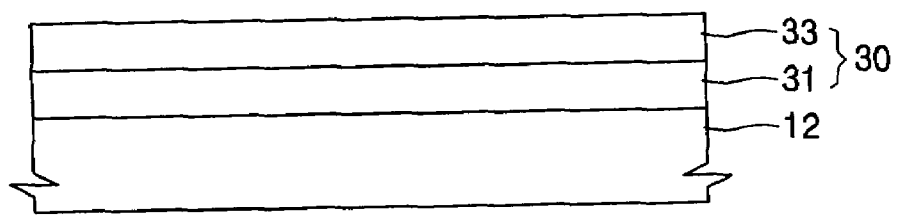
FIG. 2 is a sectional close-up view of an anti-reflection layer of the conventional imaging device of FIG. 1.
Figure 3:
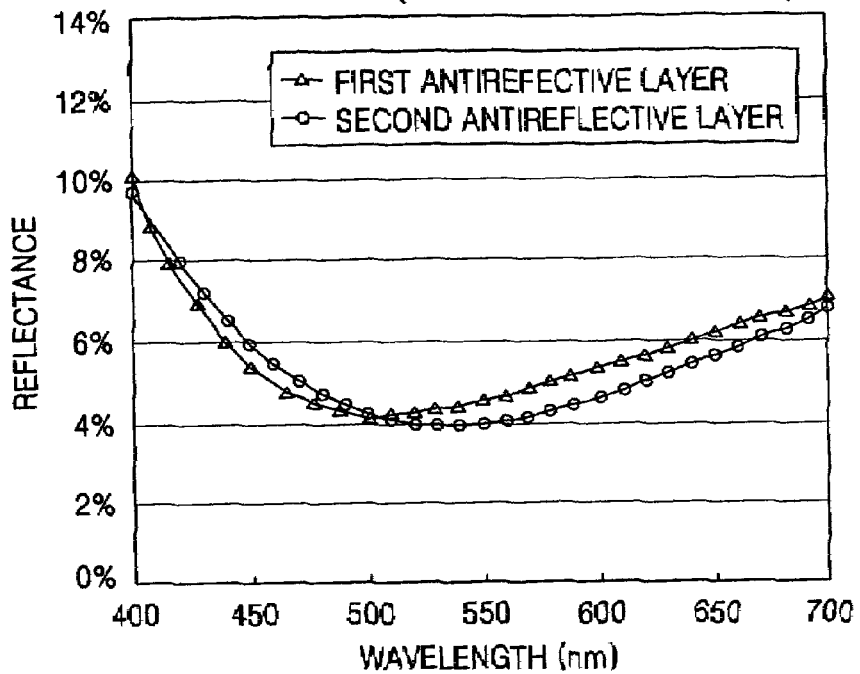
FIG. 3 is an experimental graph illustrating reflectance as a function of the wavelength of light as a result of the application of conventional first and second anti-reflection layers.
Figure 9:
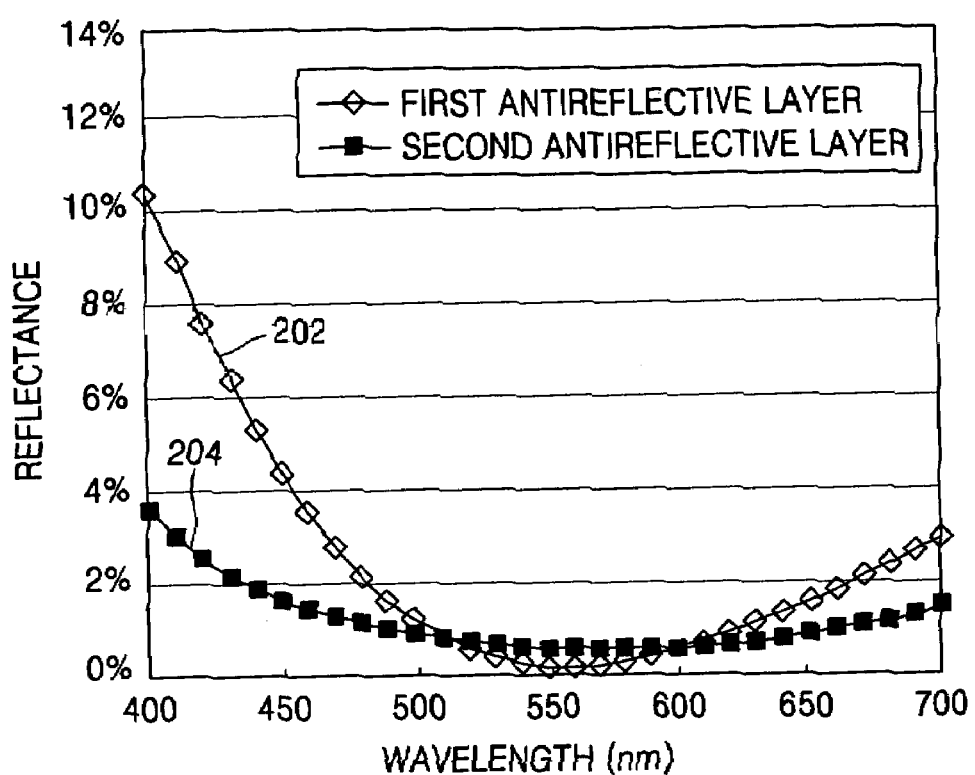
FIG. 9 is an experimental graph illustrating reflectance as a function of light wavelength for the first and second embodiments, in accordance with the present invention.

FIG. 9 is an experimental graph illustrating reflectance as a function of light wavelength for the first, second, and third embodiments respectively including the anti-reflection layers of the present invention. In this graph it can be seen that as a result of the presence of the first anti-reflection layer 130, charted by graph 202, there is a significant decrease in resulting reflectance over a majority of the band of wavelengths between about 400-700 nm, as compared to the conventional embodiments the experimental results for which are graphed in FIG. 3 above. In the second and third embodiments of the present invention, which include multiple anti-reflection layers 140' that includes multiple layers, an even further improvement in resulting reflectance is demonstrated over a majority of the band of wavelengths. The above embodiments depicted in FIGS. 6, 7 and 8 are described above in conjunction with a charge-coupled device (CCD)-type image sensors. However, the principles of the present invention are equally applicable to other forms of image sensors such as CMOS image sensors (CIS). Application of the present invention to a CIS-type device will now be described with reference to FIG. 10.

FIG. 10 is a cross-sectional view of an embodiment of a CMOS image sensor (CIS) in accordance with the present invention. In the embodiment of FIG. 10, a p type epitaxial layer 212 is formed on a semiconductor substrate 210. A p well region 214 is formed in a top portion of the substrate 210. Shallow trench isolation structures 220 are formed as shown and define an active region 221 therebetween.

An n type photodiode device (PD) region 216 is formed at one side of the active region, and an optional p type hole accumulation layer (HAL) region 218 is formed at a top portion of the photodiode device region 216. A p type transfer region 224 is provided adjacent the photodiode device region 216, and an n+ floating diffusion (FD) region 226 is formed adjacent the transfer region 224 opposite the photodiode device region 216. An anti-reflection layer 266 comprising a silicon dioxide layer 264 and silicon oxynitride layer 262 are formed on the hole accumulation layer 218 as described above. The silicon oxynitride layer is heat-treated, as described above, either immediately following its application, or during subsequent processing, in order to increase the index of refraction of the layer to a desired level, as described above. The anti-reflection layer 266 may comprise a layer configured in accordance with the first embodiment shown above in FIG. 6F, or may comprise a layer configured in accordance with the second or third embodiments of FIG. 7E or FIG. 8D, as described above. The silicon oxynitride layer 262 is formed by plasma enhanced chemical vapor deposition (PECVD) as described above, such that the refractive index of the material can be increased during the subsequent heat treatment.

A transfer gate oxide 228 and transfer gate metal 230 are formed on the transfer gate 224. A multiple-layered interlayer dielectric 236 is formed over the resulting structure, and an inter-layer vias 232, for example comprising tungsten or copper vias, are formed through the interlayer dielectric in order to make contact with the transfer gate 230 and the floating diffusion region 226 as shown. Metal interconnects, for example comprising aluminum or copper 234, are formed on the interlayer vias 232 and at other vertical positions above the resulting structure. Multiple intermetal dielectric layers are subsequently formed, each layer having corresponding metal interconnects 234 and inter-layer vias 232 for routing electronic signals from the transfer gate 230 and the floating diffusion region 226 and for routing other device signals. The metal interconnects 234 are laterally positioned so as not to interfere with the introduction of light into the photodiode device region 216. Metal interconnects 234A formed on a top layer of the interlayer dielectric 236 are coated with a buffer layer 238 comprising silicon nitride, silicon dioxide, or silicon oxynitride.

An optional inner lens 240 comprising silicon nitride is formed on the buffer layer along the incident light path. The inner lens 240 is formed in one example by first forming a silicon nitride layer on the underlying interlayer dielectric 236 and metal interconnects 234A. A photoresist layer is formed on the silicon nitride layer, and the photoresist layer is patterned to form a photoresist structure. The photoresist structure is re-flowed to have a lens-type curvature and the silicon nitride layer is etched back using the curved reflowed photoresist structure as an etch mask. In this manner, a similarly curved silicon nitride inner lens 240 is formed.

A first planarization layer comprising resin is formed on the resulting structure and is planarized. An optional color filter 244 is formed on the first planarization layer 258, and a second planarization layer 246, for example comprising resin, is formed on the color filter 244, and planarized. A microlens 250 comprising resin is formed on the second planarization layer 246 as described above. In the CIS embodiment, the size of the resulting pixels is reduced and the number of pixels increased, such that the CIS embodiment enjoys application in compact systems such as mobile telephones that include cameras. However, as a consequence of the relatively small size of the pixel, the photodiode receives less light energy. The antireflection layer of the present invention improves the efficiency of light transfer in these applications.

As in the CCD example of FIGS. 6, 7, and 8 above, the application of the silicon oxynitride layer 262 to the CIS embodiment of FIG. 10, and the subsequent heat treatment of the silicon oxynitride layer 262 results in a layer having a refractive index on the order of about 2.3-3.0, preferably about 2.4-2.6. Formation of the silicon oxynitride layer 262 using PECVD is preferred, since the properties of the material deposited in this matter are such that the refractive index can be raised from an initial value of about 2.0 following deposit to a value in the range of 2.3-3.0 following the heat treatment. This higher index of refraction in the anti-reflection layer 266 results in reduced reflectivity at the upper surface of the photodiode device (PD) 216 region of the device, which can have a relatively high index of refraction at about 4.5, as compared to the relative low indices of refraction of the upper layer of the device, including the microlens 250 (n=1.6), first and second planarization layers 246, 258 (n=1.6), color filter 244 (n=1.6), inner lens 240 (n=2.0) and interlayer dielectric layers 236 (n=1.5). As described above, a large difference in index of refraction at the junction of two different materials can cause increased reflectivity at that junction. The oxynitride antireflection layer 262 of the present invention avoids this problem by serving as a transition layer between the relatively high index of refraction photodiode layer in the semiconductor substrate, and the relatively low index of refraction in the interlayer dielectric 236, and upper layers of the device. The reduced reflectivity at this junction promotes increased transfer of photons into the photodiode device region 216 of the CIS, which is an important consideration as the trend of ever-increasing device integration continues.

While this invention has been particularly shown and described with references to preferred embodiments thereof, it will be understood by those skilled in the art that various changes in form and detail may be made herein without departing from the spirit and scope of the invention as defined by the appended claims.

For example, the present invention is applicable to use with any type of photosensitive device, including photodiodes, phototransistors, photogates, pinned photodiodes, threshold-voltage-modulated MOSFETs, avalanche diodes, Schottky diodes, p-i-n diodes back-side illumination devices, quantum well devices, and the like. In addition, while the present specification describes in detail one form of CIS pixel device, with reference to FIG. 5, that utilizes five transistors, the present invention is equally applicable to other CIS pixel structures, for example including the three-transistor structure, four transistor structure, five transistor structure, the photogate structure, and other CIS imaging device structures well known to those in the art of semiconductor imaging devices.

What is claimed is:

1. A method of forming an imaging device comprising:
    forming a photosensitive device in a semiconductor substrate, the photosensitive device including a photosensitive region;
    forming an anti-reflection layer on the photosensitive region; the anti-reflection layer comprising a silicon oxynitride layer; and
    heat treating the silicon oxynitride layer to increase a refractive index of the silicon oxynitride layer.

2. The method of claim 1 wherein forming a photosensitive device comprises forming a charge-coupled device (CCD).

3. The method of claim 2 wherein forming a charge-coupled device comprises:
    forming a charge transfer region in the substrate adjacent the photosensitive region; and
    forming a transfer gate above the transfer region; and further comprising: forming
    an insulative capping layer on the anti-refection layer;
    forming a shielding layer on the capping layer between side portions of the anti-reflection layer and the transfer gate; and
    forming a planarization layer on the shielding layer and capping layer.

4. The method of claim 3 further comprising forming an inner lens in the planarization layer.

5. The method of claim 1 wherein forming a photosensitive device comprises forming a CMOS image sensor (CIS) device.

6. The method of claim 5 wherein forming a CMOS image sensor (CIS) device comprises:
    forming a floating diffusion region adjacent a charge transfer region opposite the photosensitive region; and
    forming a transfer gate on the charge transfer region.

7. The method of claim 6 further comprising:
    forming a dielectric layer on the anti-reflection layer; and
    forming metal interconnects in the dielectric layer.

8. The method of claim 6 further comprising forming an inner lens on the dielectric layer.

9. The method of claim 6 further comprising forming a planarization layer on the inner lens and forming a microlens on the planarization layer.

10. The method of claim 9 further comprising forming a color filter layer on the planarization layer.

11. The method of claim 1 wherein forming a photosensitive device further comprises forming a hole accumulation layer (HAL) at a top portion of the photosensitive region.

12. The method of claim 1 wherein forming the anti-reflection layer comprises:

forming a first silicon dioxide layer on the photosensitive region; and forming the silicon oxynitride layer on the first silicon dioxide layer.

13. The method of claim 12 wherein forming the first silicon dioxide layer comprises depositing the first silicon dioxide layer on the photosensitive region using one of a low pressure chemical vapor deposition (LPCVD) process and an Atomic Layer Deposition (ALD) process.

14. The method of claim 12 wherein forming the silicon oxynitride layer comprises depositing the silicon oxynitride layer on the first silicon dioxide layer using plasma enhanced chemical vapor deposition (PECVD).

15. The method of claim 14 wherein forming the silicon oxynitride layer comprises depositing the silicon oxynitride layer using plasma enhanced chemical vapor deposition (PECVD) to a thickness of about 20 to 60 nm.

16. The method of claim 12 wherein forming the anti-reflection layer further comprises:

forming a second silicon dioxide layer on the silicon oxynitride layer; and forming a silicon nitride layer on the second silicon dioxide layer.

17. The method of claim 16 wherein forming the second silicon dioxide layer comprises depositing the second silicon dioxide layer on the photosensitive region using a chemical vapor deposition (CVD) process.

18. The method of claim 12 wherein heat treating the silicon oxynitride layer increases the refractive index of the silicon oxynitride layer to an amount ranging between about 2.3 and 3.0.

19. The method of claim 1 further comprising patterning the anti-reflection layer in a region above the photosensitive layer.

20. The method of claim 19 wherein patterning the anti-reflection layer comprises:

providing a photoresist layer on the anti-reflection layer;

patterning the photoresist layer above the photosensitive region; and removing the silicon oxynitride layer of the anti-reflection layer using the patterned photoresist layer as a mask.

21. The method of claim 19 wherein patterning the anti-reflection layer comprises:

providing a hard mask layer on the anti-reflection layer;

patterning the hard mask layer above the photosensitive region; and removing the silicon oxynitride layer of the anti-reflection layer using the patterned hard mask layer as a mask.

22. The method of claim 21 wherein removing the silicon oxynitride layer of the anti-reflection layer comprises removing the silicon oxynitride layer using an HF solution.

23. The method of claim 1 wherein forming the anti-reflection layer comprising the silicon oxynitride layer comprises forming the silicon oxynitride layer using plasma-based chemical vapor deposition (CVD).

24. The method of claim 23 wherein the plasma-based chemical vapor deposition comprises plasma enhanced chemical vapor deposition (PECVD).

25. The method of claim 24 wherein heat treating the silicon oxynitride layer increases the refractive index of the silicon oxynitride layer to an amount ranging between about 2.3 and 3.0.

26. The method of claim 1 wherein heat treating the silicon oxynitride layer increases the refractive index of the silicon oxynitride layer to an amount ranging between about 2.3 and 3.0.

27. The method of claim 1 wherein heat treating the silicon oxynitride layer is performed immediately following formation of the silicon oxynitride layer.

28. The method of claim 1 wherein heat treating the silicon oxynitride layer is performed during further processing of the imaging device.

29. A method of forming an imaging device, comprising:

forming a photosensitive device in a semiconductor substrate, the photosensitive device including a photosensitive region; and forming an anti-reflection layer on the photosensitive region that reduces the reflectivity of photon energy at the photosensitive device, the anti-reflection layer including a silicon oxynitride layer; the anti-reflection layer having a refractive index ranging between about 2.3 and 3.0.

30. The method of claim 29 wherein forming an anti-reflection layer comprises:

forming the anti-reflection layer proximal to the photosensitive device so that the anti reflection layer has a refractive index of about 2.0; and heat treating the silicon oxynitride layer to increase the refractive index of the silicon oxynitride layer to range between about 2.3 and 3.0.

31. The method of claim 29 wherein forming the anti-reflection layer comprises:

forming a first silicon dioxide layer on the photosensitive region; and forming the silicon oxynitride layer on the first silicon dioxide layer.

32. The method of claim 31 wherein forming the silicon oxynitride layer comprises depositing the silicon oxynitride layer on the first silicon dioxide layer using plasma enhanced chemical vapor deposition (PECVD).

33. The method of claim 31 wherein forming the anti-reflection layer further comprises:

forming a second silicon dioxide layer on the silicon oxynitride layer;

forming a silicon nitride layer on the second silicon dioxide layer.

34. The method of claim 29 wherein forming the anti-reflection layer comprising the silicon oxynitride layer comprises forming the silicon oxynitride layer using plasma-based chemical vapor deposition (CVD).

35. The method of claim 34 wherein the plasma-based chemical vapor deposition comprises plasma enhanced chemical vapor deposition (PECVD).

36. A method of forming a semiconductor image sensor, comprising:

forming a photosensitive device including a photosensitive region in a semiconductor substrate; and forming an anti-reflection layer on and proximal to the photosensitive region for reducing reflection at a top interface of the photosensitive region, the anti-reflection layer including a silicon oxynitride layer, wherein forming the anti-reflection layer comprises forming the anti-reflection layer to have a refractive index ranging between about 2.3 and 3.0.

37. The method of claim 36 wherein forming the anti-reflection layer comprises:

forming the anti-reflection layer proximal to the photosensitive device so that the anti reflection layer has a refractive index of about 2.0; and heat treating the silicon oxynitride layer to increase the refractive index of the silicon oxynitride layer to range between about 2.3 and 3.0.

38. The method of claim 37 wherein heat treating the silicon oxynitride layer comprises heat treating at a temperature greater than about 600 C.

39. The method of claim 38 wherein heat treating the silicon oxynitride layer comprises heat treating for a time duration ranging between about 30 and 360 minutes.

40. The method of claim 36 wherein forming the anti-reflection layer comprises:
   forming a first silicon dioxide layer on the photosensitive region; and
   forming the silicon oxynitride layer on the first silicon dioxide layer.

41. The method of claim 40 wherein forming the anti-reflection layer further comprises:
   forming a second silicon dioxide layer on the silicon oxynitride layer; and
   forming a silicon nitride layer on the second silicon dioxide layer.

42. The method of claim 36 wherein forming the silicon oxynitride layer comprises depositing the silicon oxynitride layer on the first silicon dioxide layer using plasma enhanced chemical vapor deposition (PECVD).

43. A semiconductor image sensor, comprising:
   a photosensitive device including a photosensitive region formed in a semiconductor substrate; and
   an anti-reflection layer proximal to the photosensitive region for reducing reflection at a top interface of the photosensitive region, the anti-reflection layer including a silicon oxynitride layer, the anti-reflection layer having a refractive index ranging between about 2.3 and 3.0.

* * * * *

UNITED STATES PATENT AND TRADEMARK OFFICE
CERTIFICATE OF CORRECTION

PATENT NO. : 7,572,571 B2  Page 1 of 1
APPLICATION NO. : 11/043702
DATED : August 11, 2009
INVENTOR(S) : Chang Rok Moon It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1234 days.

Signed and Sealed this

Fourteenth Day of December, 2010

David J. Kappos
*Director of the United States Patent and Trademark Office*